United States Patent
Edelstein et al.

(10) Patent No.: US 6,992,390 B2
(45) Date of Patent: Jan. 31, 2006

(54) LINER WITH IMPROVED ELECTROMIGRATION REDUNDANCY FOR DAMASCENE INTERCONNECTS

(75) Inventors: Daniel C. Edelstein, White Plains, NY (US); Baozhen Li, South Burlington, VT (US); Timothy D. Sullivan, Underhill, VT (US)

(73) Assignee: International Business Machines Corp., Armonk, NY (US)

( * ) Notice: Subject to any disclaimer, the term of this patent is extended or adjusted under 35 U.S.C. 154(b) by 0 days.

(21) Appl. No.: 10/702,651

(22) Filed: Nov. 7, 2003

(65) Prior Publication Data

US 2005/0098897 A1    May 12, 2005

(51) Int. Cl.
H01L 23/48    (2006.01)
H01L 23/52    (2006.01)
H01L 29/40    (2006.01)

(52) U.S. Cl. ............... 257/752; 257/750; 257/751
(58) Field of Classification Search ......... 257/752–771
See application file for complete search history.

(56) References Cited

U.S. PATENT DOCUMENTS

| | | | |
|---|---|---|---|
| 4,789,648 A | 12/1988 | Chow et al. | |
| 4,944,836 A | 7/1990 | Beyer et al. | |
| 5,221,449 A | 6/1993 | Colgan et al. | |
| 5,281,485 A | 1/1994 | Colgan et al. | |
| 6,221,757 B1 * | 4/2001 | Schmidbauer et al. | 438/625 |
| 6,291,885 B1 | 9/2001 | Cabral, Jr. et al. | |
| 6,437,440 B1 | 8/2002 | Cabral, Jr. et al. | |
| 6,509,267 B1 * | 1/2003 | Woo et al. | 438/687 |
| 6,723,635 B1 * | 4/2004 | Ngo et al. | 438/627 |
| 2004/0063310 A1 * | 4/2004 | Ngo et al. | 438/637 |
| 2004/0209456 A1 * | 10/2004 | Farrar | 438/627 |

OTHER PUBLICATIONS

Edelstein, et al., "Full Copper Wiring in a Sub-0.25mm CMOS ULSI Technology", *Tech. Dig. IEEE IEDM (International Electron Devices Meeting)*, 376, (1997).

Edelstein, et al., "A High Performance Liner for Copper Damascene Interconnects", *Digesto of Technical Pater, IEEE IITC (International Interconnect Technology Conference)*, pp. 9-11 (2001).

Edelstein, et al., "An Optimal Liner for Copper Damascene Interconnects," *AMC 2002 (Advamced Metallization Conference 2002)*, published by Mat. Res. Soc., Warrendale, PA, 541 (2002.

Li, et al., "Line Depletion Electromigration Characteristics of Cu Interconnects", IRPS 2003 (International Reliability Physics Symposium 2003).

* cited by examiner

*Primary Examiner*—Jerome Jackson
*Assistant Examiner*—Jesse A. Fenty
(74) *Attorney, Agent, or Firm*—Connolly Bove Lodge & Hutz LLP; Robert M. Trepp

(57) ABSTRACT

An interconnection structure for semiconductor integrated circuits is disclosed. The interconnection structure comprises a redundant layer, and at least one adhesion/diffusion barrier layer. The redundant layer comprises a metal or metal alloy selected from Ta, Mo, W, Be, Cr, Co, Ir, Ni, Nb, Os, Pd, Pt, Rb, Rh, Ru, and Th.

15 Claims, 2 Drawing Sheets

LINER WITH IMPROVED ELECTROMIGRATION REDUNDANCY FOR DAMASCENE INTERCONNECTS

FIELD OF THE INVENTION

This invention relates generally to damascene interconnects for integrated circuits comprising a conductive interconnect material such as copper (Cu) or silver (Ag), and more particularly to damascene interconnects having improved electromigration properties. This invention further relates to the use of at least one relatively high temperature metal with reasonable resistivity as a liner or electrically redundant material in damascene interconnects.

BACKGROUND OF THE INVENTION

Metallization patterns on integrated circuits can be formed by depositing a dielectric layer, patterning the dielectric layer by photolithography and reactive ion etching to form grooves or trenches, and depositing a metal layer that fills the trenches in the dielectric layer. Typically, the metal layer not only fills the trenches but also covers the entire semiconductor wafer. The excess metal is then removed using, for example, chemical-mechanical polishing or an etchback process so that only the metal in the trenches remains. This process, called the "damascene process," can be used to avoid at least some of the problems associated with metal etching, such as, for example, lack of suitable dry-etch plasma chemistries, problems in dimension control, the formation of small gaps that are difficult to fill with the subsequent dielectric layer, and the entrapment of impurities in the inter-wiring spaces. This process is disclosed in U.S. Pat. No. 4,944,836, to Beyer et al., the entire disclosure of which is incorporated herein by reference. See also U.S. Pat. No. 4,789,648, to Chow et al., the entire disclosure of which is incorporated herein by reference.

Cu interconnects are finding increasing application in electronic devices, such as integrated circuits. The use of Cu and Cu alloys in such applications can result in several advantages over the use of aluminum and its related alloys, which have been conventionally used as chip interconnection materials. These advantages can include, for example, reduced resistivity, greater reliability, high chip yield count, and higher circuit density. Cu can also have use in interconnects made by the damascene process. For example, Cu damascene interconnects have been found to be useful in very large scale integrated (VLSI) circuits and ultra large scale integrated (ULSI) circuits. See, for example, Edelstein, et al., "Full Copper Wiring in a Sub-0.25 mm CMOS ULSI Technology", *Tech. Dig. IEEE IEDM (International Electron Devices Meeting)*, 376, (1997).

However, since copper has a tendency when used in interconnect metallurgy to diffuse into surrounding dielectric materials such as silicon dioxide, encapsulation of the copper is often desirable. One method of capping includes employing a conductive liner or barrier layer along the sidewalls and bottom surface of a copper interconnect. Alpha-phase tantalum ($\alpha$-Ta) is often used as such a liner material due to its effectiveness as a Cu diffusion barrier, relatively easy integration, and good electrical conductivity. See, for example, Edelstein, et al., "A High Performance Liner for Copper Damascene Interconnects", *Digest of Technical Papers, IEEE IITC (International Interconnect Technology Conference)*, pp. 9–11 (2001); see also U.S. Pat. Nos. 5,221,449 and 5,281,485 to Colgan, et al. and U.S. Pat. Nos. 6,437,440 and 6,291,885 to Cabral, Jr., et al. Tantalum nitride (TaN), which has relatively higher resistivity, can also be used as a liner material. Bilayer TaN/Ta, in particular, has been employed as a liner for Cu interconnects as it exploits the best properties of both films. In addition, it exploits the phenomenon exhibited by TaN to promote the formation of $\alpha$-Ta when Ta is deposited on top of TaN.

The reliability of both aluminum and copper-based interconnections in electronic circuits can be limited by a phenomenon known as electromigration (EM). In one mechanism of EM, aluminum or copper electromigrates away from a cathode region in the interconnection faster than the availability of additional atoms can take its place. This process generates a void in the interconnection. Growth of this void increases the electrical resistance of the interconnection to a point where circuit failure eventually occurs. One means of alleviating the effects of electromigration involves utilization of an electrically redundant layer, which can provide a secondary conductor in the event that a void is formed in the interconnection. See, for example, Edelstein, et al., "An Optimal Liner for Copper Damascene Interconnects," *AMC 2002 (Advanced Metallization Conference 2002)*, published by Mat. Res. Soc., Warrendale, Pa., 541 (2002).

Since $\alpha$-Ta is often used as a liner material for Cu interconnects and has relatively good conductivity, it can also be used as a redundant layer in which it can assist the main copper conductor in current distribution as well as become the main conductor in the event the copper fails due to phenomena such as electromigration.

While TaN/$\alpha$-Ta has been shown to serve adequately a dual purpose as both a barrier layer and a redundant layer for use in Cu interconnects, studies of its use as a secondary conductor in the event of Cu void formation as the result of EM stress have only been recently reported. See, Li, et al., "Line Depletion Electromigration Characteristics of Cu Interconnects", *IRPS 2003 (International Reliability Physics Symposium 2003)*.

SUMMARY OF THE INVENTION

The present invention relates to an interconnection structure for semiconductor integrated circuits. In particular, the present invention relates to an interconnection structure, which comprises a redundant layer and at least one adhesion/diffusion barrier layer. The at least one adhesion/diffusion barrier layer can be on one or both sides of the redundant layer. The redundant layer can comprise a metal or metal alloy selected from Ta, Mo, W, Be, Cr, Co, Ir, Ni, Nb, Os, Pd, Pt, Rb, Rh, Ru, and Th. The overall effective resistance of the redundant layer and any additional layers is preferably less than about 100 $\mu\Omega$-cm, and more preferably less than or equal to 50 $\mu\Omega$-cm.

BRIEF DESCRIPTION OF THE DRAWINGS

These and other features of the present invention will become apparent upon consideration of the following detailed description of the invention when read in conjunction with the drawings, in which.

DETAILED DESCRIPTION OF THE INVENTION

Figure 1:
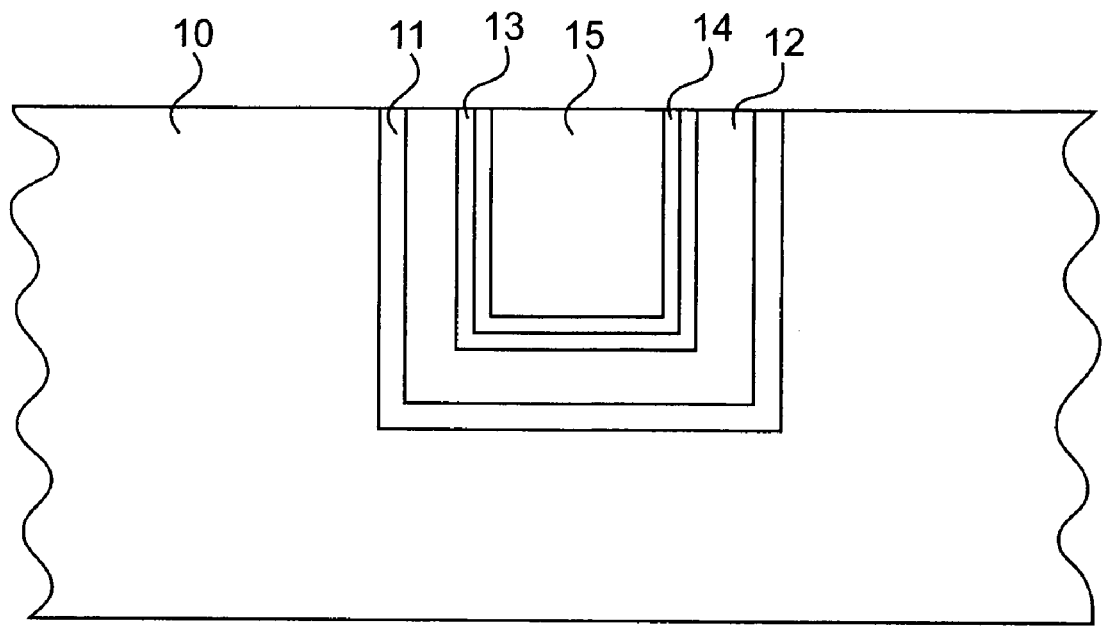
FIG. 1 shows, in cross sectional view, an interconnect structure in accordance with one embodiment of the present invention.

In the production of interconnects for integrated circuits, a redundant layer can provide a secondary conductor, which can provide a conductive path in the event a void is formed in the primary conductor. Voids in interconnects can form for a number of reasons including, for example, stress voiding, vacancy collection, and electromigration (EM). For EM in particular, which can produce voids several micrometers in length, the ability of the redundant layer to continue to carry current in the absence of the primary conductor is of great interest because failure of the redundant layer to carry current can result in failure of the entire circuit.

One criterion for electromigration stress test failure is a fractional change in resistance, such as by 20% for a particular structure. This resistance change is directly proportional to the resisitivity of the redundant layer because the redundant layer is assumed to carry essentially all of the current when a void is present. Assuming that the sheet resistance of the top surface redundant layer is given by the formula $Rsr = \rho r/tr$ (where $\rho r$ and $tr$ refer to the resistivity and top-surface deposited thickness of the redundant layer respectively), the increase in resistance in a Cu line in which a void of length Lv exists all across the line is approximated by the formula:

$$\Delta R \approx Rsr\ Lv/(2w/3 + 2h/3)$$

where w and h are the line width and height, respectively. This is an approximation for typical physical vapor deposition (PVD) to deposit the liner material. According to this approximation, the resistance increase should start at zero and increase linearly in proportion to the length of the void.

The values for $\rho r$ and $tr$ for the above equations will, of course, depend on the materials used. In one Cu metallization process, the redundant layer comprises α-Ta. In this process, trenches are first etched into a layer of oxide or other dielectric. A liner/redundant layer comprising TaN/α-Ta is then deposited, followed by a Cu seed layer, and then finally, Cu is plated into the trench filling it to the top surface of the oxide or other dielectric and beyond. Then chemical metal polishing (CMP) is used to remove excess metal from the top surface. While the α-Ta acts as a redundant layer and adhesion layer for the Cu seed, the TaN provides a diffusion barrier and adhesion layer to the oxide or other dielectric. In this system, the α-Ta redundant layer typically has an initial resistivity of about 25 $\mu\Omega$-cm and a thickness of about 50 to 200 A.

In order to test for changes in resistance resulting from the presence of a void and to determine if such changes correspond to the expected change given by the formulas above, a structure corresponding to the above Cu metallization process was tested for sheet resistance in an EM stress study. The study was conducted on packaged modules at 300° C., and about 25 mA/$\mu$m$^2$ current density. Over time, a void of about 1.7–1.8 $\mu$m in length was formed. According to the formulas above, a resistance increase of about 35 $\Omega$ was expected. The measured resistance was, however, found to be near 300 $\Omega$, suggesting that the resistance of the redundant layer α-Ta had markedly increased. Notably, the measured resistance over time did not show a linear increase of resistance beginning with zero, but rather an abrupt jump from zero to about 17 $\Omega$, followed by an essentially linear increase up to 300 $\Omega$.

The observed abrupt jump of the resistance profile may have been at least, in part, the result of a conversion, reaction, or contamination of the α-Ta redundant layer as soon as the Cu had been voided completely across the line resulting in all of the current being passed thought the Ta layer. A potential explanation may be that, during the EM stress study, the α-Ta actually converted to the less conductive beta-phase tantalum (β-Ta). This conclusion might be supported by the measured resistance of 300 $\Omega$, which correlates to a Ta resistance of about 200 $\mu\Omega$-cm. The literature indicates that β-Ta can have resistivities up to about 180 $\mu\Omega$-cm, whereas α-Ta resistivities are typically reported in the 12–18 $\mu\Omega$-cm range. In addition, it was further found that Ta resistance increase did not vary significantly with temperature for post-EM stress samples. This suggests that the post EM Ta liner has a roughly zero temperature coefficient of resistance, which is another signature of β-Ta. However, blanket film studies using x-ray diffraction showed no α to β transition at temperatures of at least up to 700° C., which exceeds the highest temperature expected for the liner under the EM stress conditions in the above study. In addition, because the phase transition temperature from α-Ta to β-Ta is relatively high and Ta readily nitridizes or oxidizes at relatively lower temperatures, the partial nitridation or oxidation of the α-Ta redundant layer as a result of Joule heating from the EM stress may be more likely (with nitrogen sourced from the adjoining TaN or oxygen sourced from the dielectric). It is also possible that resistance changes could be induced by contamination with other impurities, such as, for example, sulfur, phosphorous, or chlorine sourced by the electroplated Cu.

The ability of an interconnect to withstand EM stress can be improved if at least one other metal or alloy is substituted for α-Ta in the redundant layer or if at least one metal or metal alloy layer is interposed between the substrate adhesion layer and any outermost redundant or adhesion layer (the outermost adhesion layer being a layer that adheres well to a primary conductor interconnect material such as Cu or Ag). For example, when the outermost adhesion layer is α-Ta (which may act as both an adhesion and/or a redundant layer) and the substrate adhesion layer is TaN, a metal or metal alloy may be interposed between the TaN and the α-Ta so as to prevent possible nitridization of the α-Ta from the underlying TaN. In addition, when α-Ta is used as a redundant layer, a metal or metal alloy may be interposed between the α-Ta and primary conductor so as to prevent possible contamination of α-Ta from residual material in the trench.

The redundant layer should preferably have an initial resistance between 4 and 40 $\mu\Omega$-cm, and should not readily become contaminated, change phase, or nitridize from the underlying TaN under Joule heating from high currents. In addition, layer materials should be selected such that the overall effective resistance of the interconnect structure in the event of copper failure is preferably less than about 100 $\mu\Omega$-cm, and even more preferably less than or equal to about 50 $\mu\Omega$-cm. To preserve the advantage of low resistivity interconnects, the redundant layer and any additional layers should preferably comprise less than about 20% of the total volume of the interconnection structure, and even more preferably less than about 15% of the total volume of the interconnection structure.

Metals that may be suitable for application in the redundant layer include Ta, Mo, W, Be, Cr, Co, Ir, Ni, Nb, Os, Pd, Pt, Rb, Rh, Ru, Th, and alloys of the same. Some other refractory metals may also be suitable. Depending on the ability of the metal to adhere to the surrounding dielectric and to the primary conductor, the metal layer may be optionally incorporated into the interconnect without any intervening adhesion layers.

One embodiment falling within the scope of the present invention involves making an interconnect structure as shown in FIG. 1. In this embodiment an adhesion/diffusion barrier layer 11 comprising, for example, TaN, is deposited in trenches in a substrate 10. A redundant layer 12 comprising Ta, preferably α-Ta, is then deposited into said trenches of the adhesion/diffusion barrier layer. A thin layer 13 of TaN followed by a thin layer 14 of Ta, preferably α-Ta, is then deposited over the adhesion/diffusion barrier layer. The trench is then filled with copper or copper alloy 15. Excess metal is removed using, for example, CMP or an etchback process so that only the metal in the trenches remains. In this embodiment, the thickness of the initial adhesion/diffusion barrier layer 11 can, for example, range from about 10 to about 100 A. The thickness of the Ta redundant layer 12 can, for example, range from about 50 to about 1000 A, such as from about 50 to about 200 A. The thickness of TaN layer 13 and Ta layer 14 can, for example, each range from about 10 to about 100 A respectively. The TaN layer 13 is used to protect the redundant layer 12 from oxidation or nitridization sourced elsewhere in the trench. The final Ta layer 14 is used to provide high adhesion to the copper or copper alloy 15.

Figure 2:
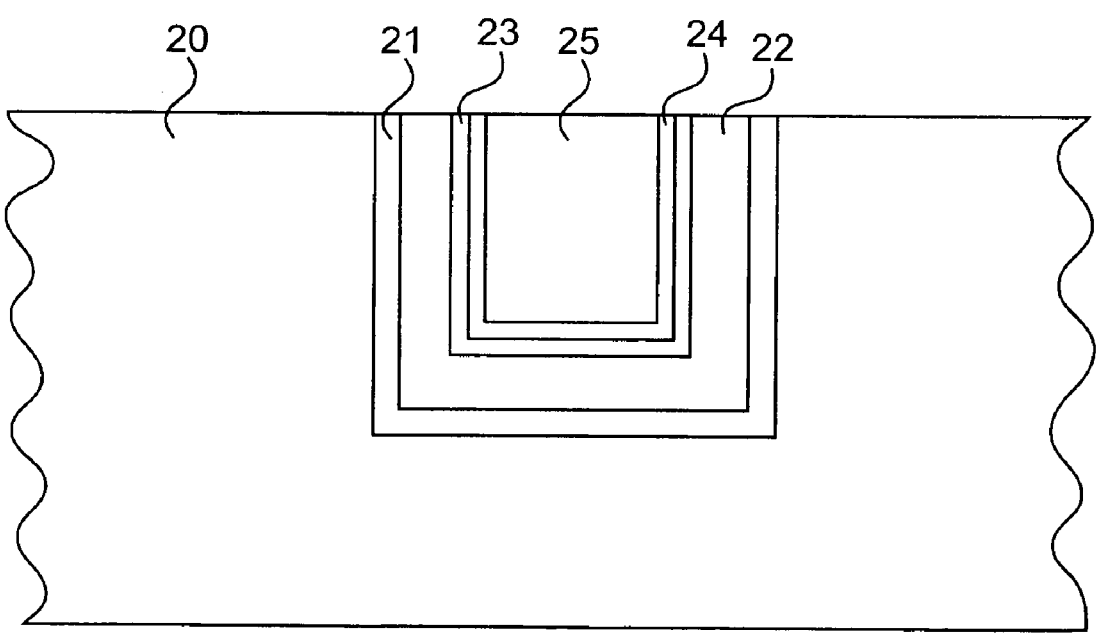
FIG. 2 shows, in cross sectional view, an interconnect structure in accordance with a second embodiment of the present invention.

A second embodiment falling within the scope of the present invention involves making an interconnect structure as shown in FIG. 2. In this embodiment, a adhesion/diffusion barrier layer 21, comprising, for example, TaN, is deposited in trenches in a substrate 20. A redundant layer 22 comprising Ta, preferably α-Ta, is then deposited into said trenches of the adhesion/diffusion barrier layer. A thin flash layer 23 of a metal selected from Mo, W, Be, Cr, Co, Ir, Ni, Nb, Os, Pd, Pt, Rb, Rh, Ru, and Th, preferably Ir, is then deposited over the Ta redundant layer. An optional thin layer 24 of Ta, preferably α-Ta, may then be deposited over the flash layer depending on the ability of the metal selected for the flash layer to adhere to copper or copper alloy. The trench is then filled with copper or copper alloy 25. Excess metal is removed as described above. In this embodiment, the thickness of the initial adhesion/diffusion barrier layer 21 can, for example, range from about 10 to about 100 A. The thickness of the Ta redundant layer 22 can, for example, range from about 50 to about 1000 A, such as from about 50 to about 200 A. The thickness of flash layer 23 and optional Ta layer 24 can, for example, each range from about 10 to about 100 A respectively. The flash layer 23 is used to protect the redundant layer 22 from oxidation or nitridization sourced elsewhere in the trench.

Figure 3:
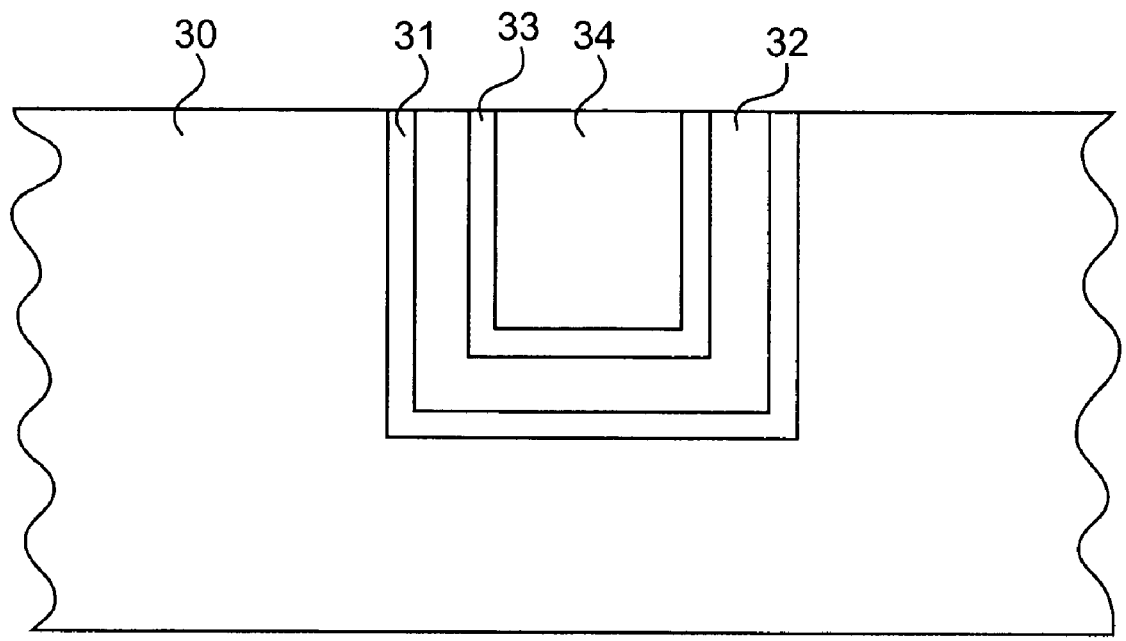
FIG. 3 shows, in cross sectional view, an interconnect structure in accordance with a third embodiment of the present invention.

A third embodiment falling within the scope of the present invention involves making an interconnect structure as shown in FIG. 3. In this embodiment, an adhesion/diffusion barrier layer 31, comprising, for example, TaN, is deposited in trenches in a substrate 30. A redundant layer 32 comprising a metal selected Mo, W, Be, Cr, Co, Ir, Ni, Nb, Os, Pd, Pt, Rb, Rh, Ru, and Th, preferably Ir, is then deposited into said trenches of the adhesion/diffusion barrier layer. An optional thin layer 33 of Ta, preferably α-Ta, may then be deposited over the redundant layer depending on the ability of the metal selected for the redundant layer to adhere to copper or copper alloy. The trench is then filled with copper or copper alloy 34. Excess metal is removed as described above. In this embodiment, the thickness of the initial adhesion/diffusion barrier layer 31 can, for example, range from about 10 to about 100 A. The thickness of the redundant layer 32 can, for example, range from about 50 to about 1000 A, such as from about 50 to about 200 A. The thickness of the optional Ta layer 33 can, for example, range from about 10 to about 100 A. In this embodiment, the redundant layer 32 is selected so that, preferably, it will not oxidize or nitridize either from the adhesion/diffusion barrier layer 31 or from sources elsewhere in the trench.

Figure 4:
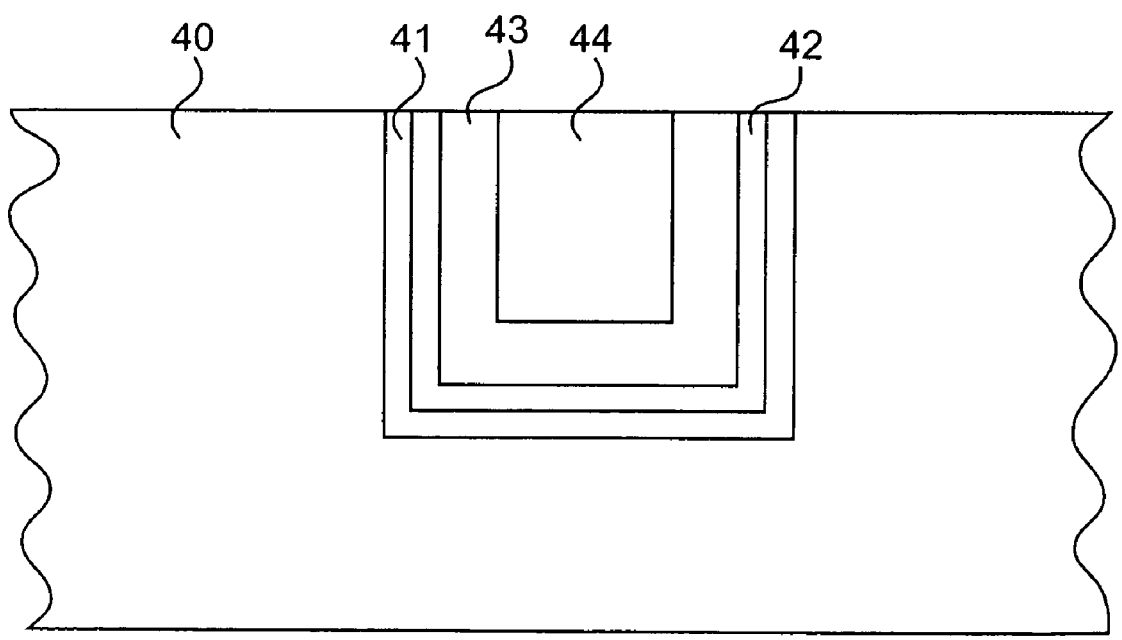
FIG. 4 shows, in cross sectional view, an interconnect structure in accordance with a fourth embodiment of the present invention.

A fourth embodiment falling within the scope of the present invention involves making an interconnect structure as shown in FIG. 4. In this embodiment, an adhesion/diffusion barrier layer 41, comprising, for example, TaN, is deposited in trenches in a substrate 40. A thin flash layer 42 of a metal selected from Mo, W, Be, Cr, Co, Ir, Ni, Nb, Os, Pd, Pt, Rb, Rh, Ru, and Th, preferably Ir, is then deposited into said trenches of the adhesion/diffusion barrier layer. A redundant layer 43 comprising Ta, preferably α-Ta, is then deposited over the flash layer. The trench is then filled with copper or copper alloy 44. Excess metal is removed as described above. In this embodiment, the thickness of the initial adhesion/diffusion barrier layer 41 and flash layer 42 can, for example, each range from about 10 to about 100 A respectively. The thickness of the Ta redundant layer 43 can, for example, range from about 50 to about 1000 A, such as from about 50 to about 200 A. In this embodiment, the flash layer 42 is used to protect the redundant layer 43 from potential nitridization from the adhesion/diffusion barrier layer 41.

What is claimed as new and desired to be protected by Letters Patent of the United States is:

1. An interconnection structure for semiconductor integrated circuits which comprises a substrate comprising at least one dielectric layer comprising at least one trench in said dielectric layer, an adhesion/diffusion barrier layer in said trench, a redundant layer on said adhesion/diffusion barrier layer, an overlayer on said redundant layer, and an interconnect material on said overlayer sufficient to fill said at least one trench;
wherein:
said adhesion/diffusion barrier layer comprises a metal, a metal alloy, or metal nitride, wherein the metal is selected from the group consisting of Ta, Ti, and W;
said overlayer comprises: (i) a metal, a metal alloy, or metal nitride, wherein the metal is selected from the group consisting of Ta, Ti, and W; or (ii) a metal or metal alloy, wherein the metal is selected from the group consisting of Mo, Be, Cr, Co, Ir, Ni, Nb, Os, Pd, Pt, Rb, Rh, Ru, and Th;
said redundant layer comprises α-Ta; and
said interconnect material comprises Cu or Cu alloy and when said overlayer comprises a material selected from (i), said structure further comprises an additional layer comprising α-Ta, wherein said additional layer is between said overlayer and said interconnect material.

2. The interconnection structure of claim 1, wherein the adhesion/diffusion barrier layer comprises TaN and the overlayer comprises TaN.

3. The interconnect structure of claim 1, wherein the overlayer comprises a metal or metal alloy wherein the metal is selected from the group consisting of Co, Ir, Rh, and Ru.

4. The interconnect structure of claim 3, wherein the overlayer comprises Ir or Ir alloy and the adhesion/diffusion barrier layer comprises TaN.

5. The interconnection structure of claim 1, wherein when said overlayer comprises a material selected from (ii), said structure further comprises an additional layer comprising α-Ta, wherein said additional layer is between said overlayer and said interconnect material.

6. The interconnection structure of claim 1, wherein the overall effective resistivity of said adhesion/diffusion barrier layer, said redundant layer, and said overlayer is less than about 100 μΩ-cm.

7. An interconnection structure for semiconductor integrated circuits which comprises a substrate comprising at least one dielectric layer comprising at least one trench in said dielectric layer, an adhesion/diffusion barrier layer in said trench, a redundant layer on said adhesion/diffusion barrier layer, and an interconnect material on said redundant layer sufficient to fill said at least one trench;

wherein:
said adhesion/diffusion barrier layer comprises a metal, a metal alloy, or metal nitride, wherein the metal is selected from the group consisting of Ta, Ti, and W;
said redundant layer comprises a metal or metal alloy, wherein the metal is selected from the group consisting of Co, Ir, Rh, and Ru; and
said interconnect material comprises Cu or Cu alloy.

8. The interconnection structure of claim 7, wherein the redundant layer comprises Ir or Ir alloy and the adhesion/diffusion barrier layer comprises TaN.

9. The interconnection structure of claim 7, wherein the overall effective resistivity of said adhesion/diffusion barrier layer and said redundant layer is less than about 100 μΩ-cm.

10. The interconnection structure of claim 7, wherein said structure further comprises an overlayer, wherein said overlayer is between said redundant layer and said interconnect material.

11. The interconnection structure of claim 10, wherein the overlayer comprises a metal, a metal alloy, or metal nitride, wherein the metal is selected from the group consisting of Ta, Ti, and W.

12. The interconnection structure of claim 11, wherein the adhesion/diffusion barrier layer comprises TaN and the overlayer comprises α-Ta.

13. An interconnection structure for semiconductor integrated circuits which comprises a substrate comprising at least one dielectric layer comprising at least one trench in said dielectric layer, an adhesion/diffusion barrier layer in said trench, a flash layer on said adhesion/diffusion barrier layer, a redundant layer on said flash layer, and an interconnect material on said redundant layer sufficient to fill said at least one trench;

wherein:
said adhesion/diffusion barrier layer comprises a metal, a metal alloy, or metal nitride, wherein the metal is selected from the group consisting of Ta, Ti, and W;
said redundant layer comprises α-Ta;
said flash layer comprises a metal or metal alloy, wherein the metal is selected from the group consisting of Co, Ir, Rh, and Ru; and
said interconnect material comprises Cu or Cu alloy.

14. The interconnection structure of claim 13, wherein the flash layer comprises Ir or Ir alloy and the adhesion/diffusion barrier layer comprises TaN.

15. The interconnection structure of claim 13, wherein the overall effective resistivity of said adhesion/diffusion barrier layer, said flash layer, and said redundant layer is less than about 100 μΩ-cm.

* * * * *